United States Patent
Ebe et al.

(10) Patent No.: US 6,294,479 B1
(45) Date of Patent: Sep. 25, 2001

(54) FILM FORMING METHOD AND APPARATUS

(75) Inventors: Akinori Ebe; Satoshi Nishiyama; Kiyoshi Ogata; Yasuo Suzuki, all of Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 08/384,597

(22) Filed: Feb. 3, 1995

Related U.S. Application Data

(60) Continuation of application No. 08/024,353, filed on Mar. 1, 1994, now abandoned, which is a division of application No. 07/913,672, filed on Jul. 15, 1992, now abandoned, application No. 08/384,597, which is a continuation of application No. 08/195,846, filed on Feb. 14, 1994.

(30) Foreign Application Priority Data

| | | |
|---|---|---|
| May 21, 1992 | (JP) | 4-128567 |
| May 21, 1992 | (JP) | 4-128568 |

(51) Int. Cl.[7] .................................................. H01L 21/31
(52) U.S. Cl. .................. 438/758; 438/761; 438/763; 118/718; 118/723 VE; 118/723 FI; 118/723 EB; 204/298.05; 204/298.08
(58) Field of Search ...................... 118/723 VE, 723 EB, 118/723 FI, 718; 427/533; 204/298.05, 298.24

(56) References Cited

U.S. PATENT DOCUMENTS

| | | | |
|---|---|---|---|
| 4,683,149 | * | 7/1987 | Suzuki et al. . |
| 4,759,948 | * | 7/1988 | Hashimoto et al. . |
| 4,828,870 | * | 5/1989 | Ando et al. . |
| 4,875,284 | * | 10/1989 | Ogata et al. ........................... 29/830 |
| 5,009,923 | * | 4/1991 | Ogata et al. . |
| 5,087,476 | * | 2/1992 | Tohma et al. . |
| 5,250,327 | * | 10/1993 | Ogata et al. ........................ 427/528 |

FOREIGN PATENT DOCUMENTS

| | | |
|---|---|---|
| 0 269 112 | 6/1988 | (EP) . |
| 58-61273 | 4/1983 | (JP) . |
| 59-5436 | 1/1984 | (JP) . |
| 59-28567 | 2/1984 | (JP) . |
| 60-141869 | 7/1985 | (JP) . |
| 01-275746 | * 11/1989 | (JP) . |
| 2-149661 | 6/1990 | (JP) . |
| 02-247371 | * 10/1990 | (JP) . |
| 3-20466 | 1/1991 | (JP) . |

\* cited by examiner

*Primary Examiner*—Matthew Smith
*Assistant Examiner*—Belur Keshavan
(74) *Attorney, Agent, or Firm*—Finnegan, Henderson, Farabow, Garrett & Dunner, L.L.P.

(57) ABSTRACT

A method and apparatus for radiation of ions from an ion source 4 onto a surface of an objective substrate T and vacuum evaporation of a predetermined material from an evaporation source 5 onto the surface of the substrate, simultaneously while the substrate is continuously moved. The ion radiation from the ion source 4 is applied to a portion of a region reached by the evaporation material from the evaporation source 5, upstream relative to the direction of movement of the substrate from the center of that region and which is lower in evaporation speed than the center of the region, to thereby continuously form a mixture layer of substrate material atoms and evaporation material atoms on the surface of the substrate and then continuously form a vacuum evaporation film with a predetermined thickness on the mixture layer.

3 Claims, 3 Drawing Sheets

FILM FORMING METHOD AND APPARATUS

This application is a continuation of application Ser. No. 08/024,353, filed Mar. 1, 1994, now abandoned which is a division of application Ser. No. 07/913/672, filed Jul. 15, 1992, now abandoned in favor of continuation application Ser. No. 08/195,846 filed Feb. 14, 1994.

BACKGROUND OF THE INVENTION

1. Field of the Invention

The present invention relates to a film forming method for continuously forming a desired film on a surface of a substrate selected from various kinds of materials such as macromolecular materials, metals, glass, ceramics, etc., and an apparatus therefor.

2. Description of the Related Art

In recent years, film forming using vacuum evaporation of a particular material onto the surface of a substrate has been widely adapted for forming a metal film as a printed wiring precursor onto a printed wiring substrate formed from a macromolecular material, forming a of a corrosion-resisting film onto a surface of a substrate formed from stainless steel or the like, and forming of a semiconductor film onto a liquid crystal display glass substrate, for example. Such vacuum evaporation film forming has an advantage in that the film forming speed is relatively high compared with film forming using sputtering or the like.

Vacuum evaporation film forming, however, has a problem in that mutual adhesion at the interface between the substrate surface and the film formed thereon is to weak that the film may be separated from the substrate when the substrate is processed after the film is formed. For example, where an aluminum film for printed wiring is formed on a surface of a printed wiring substrate formed of a polyimide film, a problem arises in that the aluminum film may be separated by exposure of the film to high or low temperature after the film is formed. In the case where a corrosion-resisting aluminum film is formed on a stainless steel substrate, for example, the aluminum film may be broken or separated when the stainless steel substrate is processed by bending, pressing or the like after the film is formed.

A method has been heretofore proposed to solve the aforementioned problems and in which vacuum evaporation of a particular material onto a surface of a substrate and ion radiation are used in combination to form an adhesive mixed layer of constituent atoms of the substrate material and constituent atoms of an evaporated material on a portion of the substrate surface to form an evaporation film of the same material and of a predetermined thickness on the mixed layer with good adhesion.

In forming the mixing layer to improve the adhesion, all the thickness of the resulting film is not necessary. That is, a film with an arbitrary thickness is formed by vacuum evaporation after the mixing layer is formed by ion radiation adjacent to the interface between the substrate and the film.

In such a film forming process using a combination of vacuum evaporation and ion radiation, continuous movement of a strip-like or plate-like substrate has been proposed for the purpose of film forming efficiency.

FIG. 5 shows an example of an apparatus for performing such continuous film forming, in which a vacuum vessel 9 capable of being kept in a predetermined vacuum by an exhaust device (not shown), is partitioned into two portions 91 and 92. One portion 91 is used for a material evaporation source 93 and an ion source 94 for forming a mixed layer, and the other portion 92 is used for a material evaporation source 95 for forming an evaporation film of predetermined thickness on the mixed layer. A substrate 96 is passed from the one portion 91 to the other portion 92 so that the mixed layer is formed at the portion 91 and then the evaporation film of predetermined thickness is formed at the portion 92.

The reason why the vacuum vessel 9 is partitioned into two film forming portions 91 an 92 is that if the film forming condition is suited to the moving speed of the substrate, it is necessary to reduce the speed of evaporation to satisfy the quantity of ion radiation in the mixed layer forming step. If the total film forming speed is increased, it is necessary to change the speed of evaporation between the mixed layer forming step and the evaporation film forming step.

Another method and apparatus have been proposed as described in Japanese Patent Unexamined Publication No. Sho-60-141869. In this proposed film forming method and apparatus, a first ion source, a first evaporation source, a second ion source and a second evaporation source (which may be combined with an ion plating means) are disposed in a vacuum vessel along the direction of substrate feed to carry out a pretreatment, such as cleaning, of the substrate surface using the first ion source, form an evaporation film for forming a mixed layer using the first evaporation source, form the mixed layer by ion radiation with the second ion source and form an evaporation film of a predetermined thickness on the mixed layer with the second evaporation source.

In the film forming method and apparatus described in each of FIG. 5 and Japanese Patent Unexamined Publication No. Sho-60-1414869, not only at least one ion source and one evaporation source are necessary for forming the mixed layer, but at least one evaporation source is also necessary for forming the evaporation film. Thus, a problem is present in that the number of evaporation sources is increased and film forming cost is increased.

In the method and apparatus described in Japanese Patent Unexamined Publication No. Sho-60-141869, the mixed layer is formed by performing ion injection with the second ion source after forming the evaporation film using the first evaporation source. Accordingly, ion energy due to the second ion source must be enlarged. Otherwise, great reduction of the substrate feeding speed may be considered, but production efficiency is compromised if the substrate feeding speed is reduced greatly.

SUMMARY OF THE INVENTION

The present invention has been made in view of the above circumstances and has an object to provide a film forming method and a film forming apparatus in which a film with good adhesion characteristics can be continuously formed on a substrate easily, at low cost and with good productivity as compared with the conventional method and apparatus.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the present invention provides a film forming method characterized by forming a mixed layer of substrate material atoms and evaporation material atoms on a surface of an objective substrate by vacuum evaporation of a predetermined amount of material from an evaporation source to the surface of the substrate and radiation of ions from an ion source while the substrate is moved in a predetermined direction, and forming a film with a predetermined thickness the mixed layer, using the evaporation source, by vacuum evaporation while the substrate is continuously moved in a direction the same as or opposite to the predetermined direction after the mixed layer has been at least partially formed on a predetermined portion of the substrate surface by the first-mentioned step.

The present invention further provided a film forming method characterized in that ions are radiated from an ion source onto a surface of an objective substrate and, at the same time, a predetermined amount of material from an evaporation source is transferred by vacuum evaporation to the surface of the substrate while continuously moving the substrate, the ion radiation being applied to a substrate portion upstream in the direction of substrate movement, which is lower in evaporation speed than a center portion of a region reached by the evaporation material from the evaporation source, so that a mixed layer of substrate material atoms and evaporation material atoms is formed continuously on the surface of the substrate and then a vacuum evaporation film with a predetermined thickness is continuously formed on the mixed layer.

The objects and purpose of the present invention are further achieved by a film forming apparatus comprising means for continuously moving an objective substrate, an evaporation source for vacuum evaporation of a predetermined material onto a surface of the moving substrate, and an ion source for radiating ions on the surface of the moving substrate, the substrate continuously moving means being arranged so as to move the substrate in a predetermined direction to form a mixed layer of substrate material atoms and evaporation material atoms, and moving the substrate in a direction the same as or opposite to the predetermined direction at the time of forming the mixed layer, in another step, to form a film with a predetermined thickness with the evaporation source on the mixed layer by vacuum evaporation.

The present invention also provides a film forming apparatus characterized by means for continuously moving an objective substrate, an evaporation source for vacuum evaporation of predetermined material onto a surface of the moving substrate, and an ion source for radiating ions to the surface of the moving substrate, the ion source being disposed so that the ion radiation from the ion source is applied to a substrate portion upstream in the direction of movement of the substrate, which is lower in evaporation speed than a center portion of a region reached by the evaporation material from the evaporation source, so that a mixed layer of substrate material atoms and evaporation material atoms is first continuously formed on the surface of the substrate and then a vacuum evaporation film with a predetermined thickness is continuously formed on the mixed layer.

In the method and apparatus according to the present invention, various means for continuously moving the substrate may be used. For example, where the substrate is shaped as an endless belt, a moving means including a plurality of pulleys to advance the substrate may be used. In the case where the substrate is shaped as a doubled ended flexible belt; a moving means including a feed reel, a dum therefor, a take-up real, and a drum to reciprocate the substrate may be used. For example, in the case where the substrate is shaped as a plate, various kinds of conveyors such as a roller conveyor to reciprocate the substrate may be considered.

In the method and apparatus according to the present invention, the direction of feeding of the substrate in the step of forming the evaporation film of the predetermined thickness on the mixed layer may be the same as the direction of feeding in the mixed layer forming step or may be opposite thereto. In the case where the substrate is shaped like a belt or a plate and is fed by reel devices or conveyor devices, the direction of feed to form the layer of evaporation material opposite to the direction in the mixed layer forming step.

In the method and apparatus according to the present invention, the ion source may be suitably arranged so that a part of the ion radiation is simultaneously applied to an upstream substrate portion outside of the region reached by the evaporation material from the evaporation source, whereby the surface of the substrate is pretreated before the formation of the mixed layer.

Further, the ion source may be suitably arranged so that the ion radiation for forming the mixture layer is carried out so that the transport ration (M/N) of the number M of evaporation material atoms to the number N of ions reaching the surface of the substrate per unit time and per unit area is in a range of from 10 to 1000.

The adhesion of the formed film to the substrate is greatly affected by the transport ratio. The preferred transport ratio varies according to the kind of the substrate, the material to be evaporated, the ion type used, the ion energy and the like, but it is generally preferable that the transport ration is in a range of from about 10 to about 1000. If the transport ratio is smaller that 10, that is, the rate of ion radiation is large, the substrate becomes so damaged that the adhesion of the film deteriorates. If the transport rate is larger that 1000, the resulting mixed layer is unsatisfactory.

In the case where the ion source is disposed so that part of the ion radiation from the ion source is applied in order to perform pretreatment before the formation of the mixed layer, just before the formation of the mixed layer, the surface of the substrate is exposed to part of the ion radiation to pretreat the substrate, such as by activating the substrate surface and cleaning to remove water, and then a mixed layer and a vacuum evaporation film are formed with a predetermined thickness.

BRIEF DESCRIPTION OF THE DRAWINGS

The accompanying drawings, which are incorporated in and constitute a part of this specification illustrate embodiment(s) of the invention and, together with the description, serve to explain the objects, advantages and principles of the invention. In the drawings.

DETAILED DESCRIPTION OF THE PREFERRED EMBODIMENTS

An embodiment of the film forming method of the present invention and an embodiment of the film forming apparatus therefor will be described hereunder with reference to the drawings.

Figure 1A:
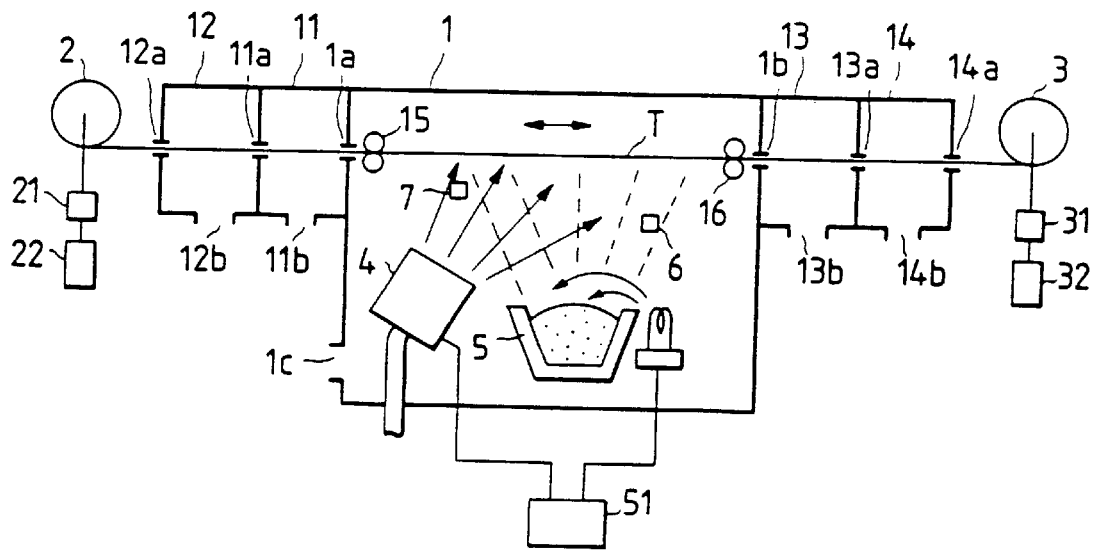
FIG. 1A is a schematic diagram of an embodiment of a film forming apparatus used for carrying out a method according to the present invention.

As shown in FIG. 1A, the film forming apparatus of the illustrated embodiment has a control film forming vacuum vessel 1. Auxiliary vacuum chambers 11 and 12 are successively connected to one side portion of the vessel 1 and a reel 2 is disposed outside of those chambers. Auxiliary vacuum chambers 13 and 14 are successively connected to the other side portion of the vessel 1. Further, a reel is disposed outside the chambers 13 and 14.

A motor 22 is connected to the reel 2 through a disengageable coupling device 21 such as an electromagnetic clutch. A motor 32 is connected to the reel 3 through a coupling device 31 such as an electromagnetic clutch. The reel 2 can be driven to rotate in a clockwise direction as shown in the drawing by turning on the motor 22 and engagement of the coupling device 21. The reel 3 can be driven to rotate in counterclockwise direction by turning on the motor 32 and engagement of the coupling device 31.

Through-holes 12a, 14a, 11a, 13a, 1a, an 1b, as small as possible to pass a strip-like substrate T extending between the reels 2 and 3, are provided in end walls of the auxiliary vacuum chambers 12 and 14, separating walls between the auxiliary vacuum chambers 11 and 12, and the auxiliary vacuum chambers 13 and 14, and separating walls between the auxiliary vacuum chambers 11 and 13 and the vacuum vessel 1, respectively. In the drawing, the reference numerals 15 and 16 designate separate pairs of guide rollers provided in the vessel 1 to guide the substrate.

Vacuum pump connection ports 1c, 11b, 12b, 13b and 14b are provided in the vacuum vessel 1 and the auxiliary vacuum chambers 11, 12, 13 and 14, respectively. A vacuum pump (not shown) is connected to the vacuum pump connection ports to evacuate the vessel 1 and the respective auxiliary chambers and to maintain the vessel 1 under a predetermined film forming vacuum.

In the vacuum vessel 1, an ion source 4 and an evaporation source 5 are disposed respectively on the side of the vessel near the reel 2 and on the side thereof near the reel 3. These sources face upward to the bottom surface of the substrate T supported for movement in a path by the reels 2 and 3.

The ion source 4 is capable of radiating an ion beam to the bottom surface of the substrate T. The evaporation source 5 is an electron beam evaporation source, preferably an EB evaporation source, though it is not limited thereto.

The ion source 4 an the evaporation source 5, in the embodiment of FIG. 1A, are disposed so that the center of a region, reached by the ion beam from the ion source 4 at the surface of the substrate T, substantially coincides with the center of a region to which evaporation particles from the evaporation source 5 are directed.

A film thickness monitor 6, for me assuring the quantity of vapor deposition, is disposed to one side of the region reached by the evaporation material. A beam monitor 7, for measuring the quantity of ion radiation, is disposed to one side of the region to which ions are directed, and on the opposite side of the coincident region from the monitor 6.

The ion source 4 and the evaporation source 5 are connected to an radiation quantity and vapor deposition quantity control component 51, to which outputs (not shown) from the monitors 6 and 7 are inputted. On the basis of an instruction given by the control component, the ion source 4 supplies necessary and suitable ion radiation at the time of forming a mixed layer to be described, and the evaporation source 5 regulates the quantity of vapor deposition at one level during formation of the mixed layer and at a different level during the step of formation of an evaporation film on the mixed layer, as will also be described in more detail below. In operation of the aforementioned film forming apparatus embodiment, the method of the invention is carried out in the following manner.

A strip-like objective substrate T is preliminary wound on the reel 2. A leading end of the substrate is passed through the holes 11a, 12a, 13a, 14a, 1a and 1b in the auxiliary vacuum chambers 11, 12, 13 and 14 and the vacuum vessel 1 and is connected to the other reel 3. In this condition, coupling device 21 for the reel 2 is disengaged, whereas the coupling device 31 for the reel 3 is engaged. The auxiliary vacuum chambers 11, 12, 13 and 14 and the vacuum vessel 1 are evacuated by a vacuum pump (not shown) so that the vacuum vessel 1 is maintained under a film forming vacuum of about $1 \times 10^{-6}$ to about $1 \times 10^{-4}$ (Torr).

While an evaporation material, such as a metal, preliminary stored in at he evaporation source 5, is evaporated from the evaporation source 5 to the surface of the substrate T and, at the same time, an ion beam of inert gas, such as argon gas, is radiated from the ion source 4 to the surface of the substrate T, the motor 32 for the reel 3 is operated to continuously move the substrate T in a predetermined direction and at a predetermined speed so that the substrate T is taken up on the reel 3 from the reel 2.

A mixed layer of constituent atoms of the material of the substrate T and constituent atoms of the evaporation material is thus continuously formed on the bottom surface of the substrate T by vacuum evaporation of the evaporation material onto the surface of the continuously moving substrate T and, at the same time, by ion radiation of the bottom surface.

In forming the mixed layer, the level of evaporation of the evaporation material and the level of ion radiation are adjusted by the control portion 51 to exhibit a transport ration, that is, the ration (M/N) of the number M of evaporation material atoms to the number N of ions reaching the surface of the substrate per unit time and per unit area, to obtain good layer adhesive quality with respect to the current density of the ion source 4. The ion type and energy at ion radiation, the transport ratio and the thickness of the mixed layer vary according to the kind of the evaporation material and the kind of the substrate, but it is preferable that the ion energy, the transport ration (M/N) and the thickness of the mixed layer are about 500 eV to about 20 KeV, about 10 to about 1000 and about 100 to 3000Å, respectively. The mixed layer of good adhesive quality is formed on the substrate in this manner. If the transport ration (M/N) is smaller than 10, that is, the rate of ion radiation is higher, the substrate becomes so damaged that adhesion deteriorates. If the transport rate is large than 1000, or rate of ion radiation is smaller, the resulting mixed layer is unsatisfactorily.

After the mixed layer is roughly formed on a predetermined portion of the surface of the substrate T, the coupling device 31 for the reel 3 is disengaged and the coupling device 21 for the reel 2 is engaged. The motor 22 then operated to rewind the substrate T from the reel 3 to the reel 2 and to move the substrate T continuously in a direction opposite to the direction of movement during the mixed layer forming step. While the ion source 4 is deactivated during movement of the substrate T in the opposite direction, the evaporation source 5 is operated on the basis of an instruction given from the control component 51 at a level of evaporation to form a vacuum evaporation film of predetermined thickness on the mixed layer.

The vacuum evaporation film of predetermined thickness is continuously formed until finished on the mixed layer formed by the first step. The film thus formed on the substrate T is totally adhered to the substrate T because of the excellent adhesion of the mixed layer to the surface material of the substrate T. Moreover, the film is easily obtained at low cost by one ion source and one evaporation source. Also, in each of the two processing steps, the substrate T is fed continuously so that the efficiency in production of the film is good.

A specific example of film forming using the aforementioned apparatus will be described hereunder.

Substrate T: strip-like stainless steel plate

Feeding speed: 6 m/min in each of the two steps

Evaporation material based on the evaporation source 5: aluminum

Film forming vacuum: $5.0 \times 10^{-5}$ Torr

Speed of film forming from the evaporation source 5 during the mixed layer forming step: 500 Å/sec Speed of film forming from the evaporation source 5 onto the mixed layer: 2000 Å/sec Ion source 4: Ion type: Argon ion Energy: 2 KeV Beam current density: 0.8 mA/C$^2$.

Surface ion beam size at the substrate surface:
150 mm in the substrate feeding direction,
700 mm in the direction perpendicular thereto.

Transport ration M/N in the mixed layer forming step:

Al/Ar ion=60

An aluminum film was thus formed on the stainless steel plate with good adhesion, the thickness of the mixed layer and the thickness of the aluminum film being about 1000Å and about 1 µm, respectively.

Figure 2:
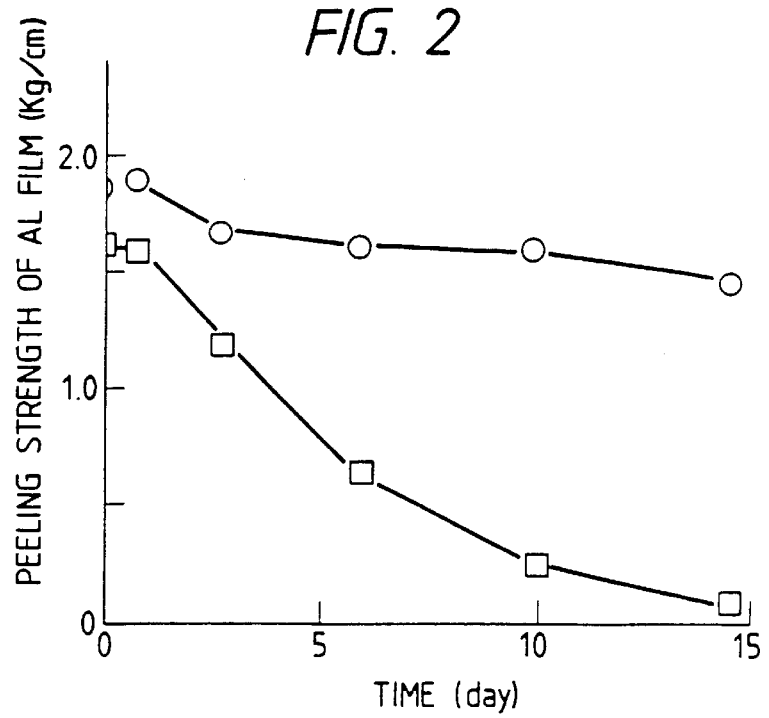
FIG. 2 is a graph showing the result of an aluminum film peeling strength test on a stainless steel plate.

To provide a comparative test of the adhesion of the aluminum film formed by the aforementioned specific example, a stainless steel plate having an aluminum film was formed in the same manner as in the specific example, except that ion radiation for forming the mixed layer was not used. The two test specimens were exposed to a temperature of 150° C. for aluminum film peeling strength test according to JISC-5016 after a predetermined time had passed. The result of the test is shown in FIG. 2. In the graph of FIG. 2, the line expressed by the symbol Δ shows the aluminum film in the specific example, and the line expressed by the symbol □ shows the aluminum film in the comparative example.

It is obvious from the results of the test that the adhesion of the aluminum film is reduced greatly with the passage of time in the comparative example, not using ion radiation for forming the mixed layer, whereas the adhesion of the aluminum film is maintained stable with the passage of time in the specific example according to the present invention, using ion radiation for forming the mixed layer.

It is to be understood that the present invention is not limited to the aforementioned apparatus embodiment and that it can be provided as variations thereof. For example, the reels 2 and 3 may be disposed in the vacuum vessel 1 and auxiliary vacuum chambers 11 to 14 may be omitted. Also, a part of ion radiation from the ion source 4 may be used for ion radiation in a pretreatment before the formation of the mixed layer. In this case, a part of ion radiation may be directed to a preliminary treatment region not reached by the evaporation particles.

A second embodiment of the film forming method according to the present invention and an embodiment of the film forming apparatus therefor will be described hereunder with reference to the FIG. 1B of the drawings, which schematically shows the film forming apparatus of the second embodiment.

Figure 1B:
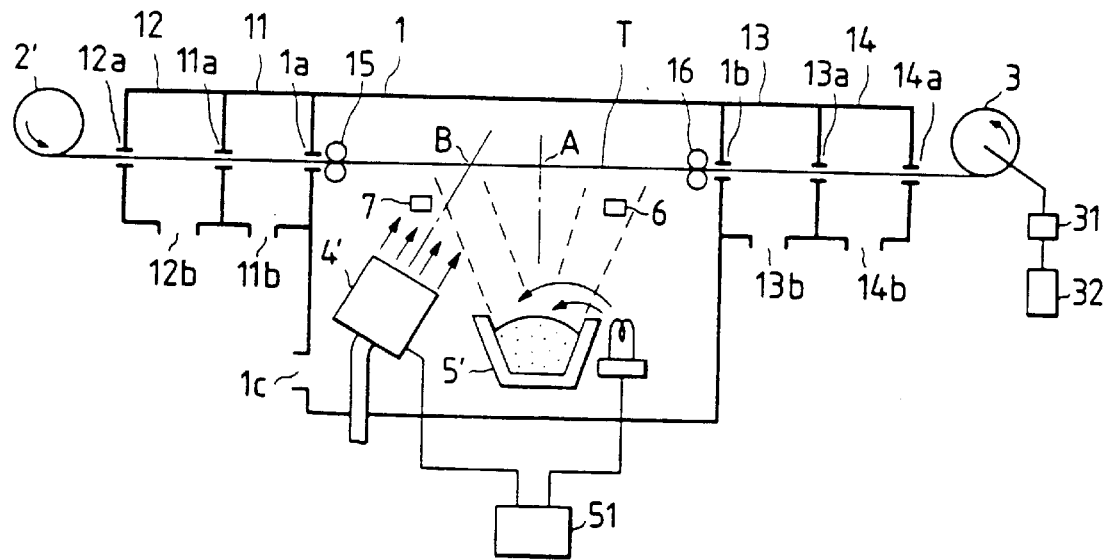
FIG. 1B is a schematic diagram of a modified embodiment of a film forming apparatus used for carrying out a method according to the present invention.

The film forming apparatus in FIG. 1B is, with slight modification of previously described components, very similar to the embodiment of FIG. 1A. Thus, the components in FIG. 1B which are identical to components in FIG. 1A are designated by the same reference numerals and will not be further described. Modified components in the embodiment of FIG. 1B are designated by primed reference numerals otherwise the same as those in FIG. 1A.

In the embodiment of FIG. 1B, the reel 2' is freely rotatable and, if necessary, provided with a braking or drag device for suppressing rotation due to inertia. As in the embodiment of FIG. 1A, the motor 32 is connected to the reel 3 through a coupling device 31 such as an electromagnetic clutch. The reel 3 can be driven to rotate counterclockwise in the drawing by turning on the motor 32 and by engagement of the coupling device 31.

Another modification of the embodiment of FIG. 1B, as compared with that of FIG. 1A, is that the ion source 4' and the evaporation source 5' are disposed so that the region, which the ion beam from the ion source 4' reaches at the surface of the substrate T, is shifted to the upstream side in the direction of feeding of the substrate relative to the region reached by the evaporation material from the evaporation source 5', that is to say, shifted to the upstream side of the evaporation region at which lower evaporation speeds are present.

In all other respects the structural organization of the embodiment of FIG. 1B is the same as FIG. 1A.

During operation of the film forming apparatus shown in FIG. 1B, a second method embodiment of the invention is carried out.

A strip-like objective substrate T is preliminary wound on the reel 2. A leading end of the substrate is passed through the holes 11a, 12a, 13a, 14a, 1a and 1b in the auxiliary vacuum chambers 11, 12, 13 and 14 and the vacuum vessel 1 and is connected to the other reel 3. The auxiliary vacuum chambers 11, 12, 13 and 14 and the vacuum vessel 1 are evacuated by a vacuum pump (not shown) so that the vacuum vessel 1 is kept in a film forming vacuum of about $1 \times 10^{-6}$ to about $1 \times 10^{-4}$ (Torr).

Thereafter, while an evaporation material, such as a metal preliminary stored in the evaporation source 5, is evaporated from the evaporation source 5 to the surface of the substrate T, at the same time an ion beam of inert gas, such as argon gas, is radiated from the ion source 4 to the surface of the substrate T. The motor 32 drives the reel 3 to continuously move the substrate T in a predetermined direction at a predetermined speed so that the substrate T is taken up by the reel 3 from the reel 2.

Vacuum evaporation of an evaporation material onto the bottom surface of the continuously moving substrate T, and radiation of ions from the ion source 4' are carried out simultaneously. In this embodiment, however, the ions from the source 4' are directed to a region displaced from the center portion of the evaporation region, or to a portion of the evaporation region receiving a relatively low level of evaporation material atoms. In other words, the region of ion radiation is at a portion of the evaporation region exhibiting a transport ration M/N in which a mixed layer of good adhesion is formed. Thus, a mixed layer of constituent atoms of the substrate material and constituent atoms of the evaporation material is continuously formed on the surface of the substrate simultaneously with the continuous formation of a vacuum evaporation film of a predetermined thickness on the mixed layer. The evaporation material layer is formed at high speed by passing the mixed layer through the center portion of the evaporation region, which is higher in evaporation speed, and a lower evaporation material formation speed portion of that region following the center portion.

In the formation of the mixed layer in the second process embodiment, the radiation ion type and ion energy, the transport rate and the thickness of the mixed layer vary according to the kind of the material and the kind of substrate, but it is preferable that the ion energy, the transport ration (M/N) and the thickness of the mixed layer are in ranges of from about 500 eV to about 20 KeV, from about 10 to about 1000 and from about 100 to 3000Å, respectively. The control component 51 controls the ion source 4 and the evaporation source 5 to maintain these parameters respectively in the aforementioned ranges.

In each of the two steps, the substrate T is fed continuously so that the good production efficiency is obtained. A specific example of film forming using the apparatus of FIG. 1B will now be described.

Substrate T: strip-like stainless steel plate

Feeding speed: 6 m/min.

Evaporation material based on the evaporation source 5: aluminum

Film forming vacuum: 5.0 $10^{-5}$ Torr

Speed of film forming from the evaporation source 5: 2000 Å/sec

Ion source 4:

This is disposed so that a center axial line of an ion beam electrode intersects the surface of the substrate at a position B shifted by 300 mm to the upstream side in the direction of movement of the substrate from a point A, the intersection between the center axial line of the evaporation source 5 and the surface of the substrate, as depicted in FIG. 1B.

The aluminum film formed by the second process embodiment was tested in the same manner as the method previously described with reference to FIG. 1A. The results were essentially the same and are thus also represented by the graph of FIG. 2 as explained above.

Another embodiment of the method according to the present invention and an embodiment of the film forming apparatus therefor will be described with reference to FIG. 3, which shows a schematic diagram of the film forming apparatus.

Figure 3:
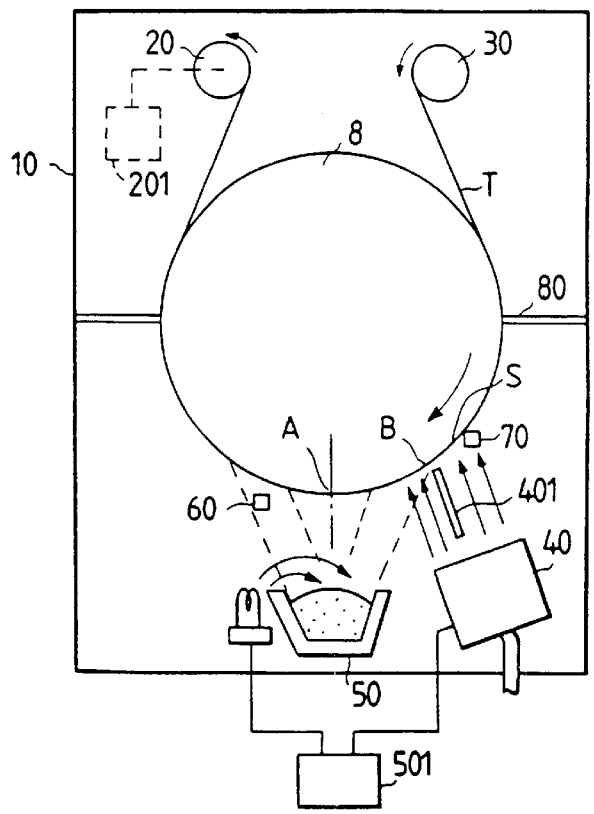
FIG. 3 is a schematic diagram of another embodiment of the film forming apparatus used for carrying out a method according to the present invention.

The film forming apparatus of FIG. 3 includes a film forming vacuum vessel 10 which a vacuum pump (not shown) is connected to maintain the vessel 10 under a predetermined vacuum.

Reels 20 and 30 are disposed in an upper portion of the vessel 10. The reel 20 is arranged to be driving to rotate counterclockwise in the drawing by a motor 201 provided outside the vessel 10. The reel 30 freely rotates, but, if necessary, a braking device for suppressing inertial rotation may be provided.

A guide drum 8, freely rotatable, is provided in the center portion of the vessel 10 so that the strip-like substrate T to be taken up from the reel 30 to the reel 20 can be supported and guided by the circumference of the guide drum 8.

An evaporation source 50 is disposed in the lower portion of the vacuum vessel 10 and directly under the drum 8. An ion source 40 is disposed to one side of the evaporation source 50 and generally under the reel 30. Further, a partition plate 80 is provided at opposite sides of the drum 8 to prevent the evaporation material and ions from entering into the chamber containing the reels 20 and 30.

The ion source 40 and the evaporating source 50 are essentially the same as those previously described.

The ion source 40 and the evaporation source 50 are disposed so that the region to which the ion beam from the ion source 40 reaches the surface of the substrate T guided by the drum 8 is shifted to the upstream side, in the direction of substrate feed, from the center portion of the region reached by the evaporation material from the evaporation source 50. Thus the region reached by the ion beam is shifted to the upstream portion of the evaporation region which is lower in evaporation speed, and so that a part (in this embodiment, about one half) of the ion beam is radiated to an ion radiation pre-treatment region S adjacent to the upstream side of the evaporation material arrival region in the direction of feeding of the substrate. A deposition preventing plate 401 is provided in the vicinity of the position B of intersection between the cent of the ion beam and the surface of the substrate T on the guide drum 8 to prevent the evaporation material from depositing on the pre-treatment region.

A film thickness monitor 60 for measuring the quantity of vapor deposition is disposed at a part of the region reached by the evaporation material. A beam monitor 70 for measuring the quantity of ion radiation is disposed at a part of the region reached by ions.

The ion source 40 and the evaporation source 50 are connected to an ion radiation quantity and vapor deposition quantity control component 501, to which outputs (not shown) from the monitors 60 and 70 are inputted. On the basis of an instruction given by the control component, the ion source 40 performs suitable ion radiation necessary for the pre-treatment and for the formation of the mixed layer. The evaporation source 50 evaporates the evaporative material at a rate to achieve the quantity of vapor deposition necessary for forming the mixed layer and then for forming a vacuum evaporation film on the mixed layer.

The strip-like objective substrate T is preliminary wound on the reel 30. Then, a leading end of the substrate is wound on the circumference of the guide drum 8 and is connected to the other reel 20.

The vacuum vessel 10 is evacuated by a vacuum pump not shown so that the vacuum vessel 10 is kept in a film forming vacuum of about $1\times10^{-6}$ to about $1\times10^{-4}$ (Torr).

Then, while the evaporative material, such as a metal preliminary stored in the evaporation source 50, is evaporated from the evaporation source 50 to the surface of the substrate T on the drum 8 and, at the same time, an ion beam of inert gas, such as argon gas, is radiated from the ion source 40 to the surface of the substrate T, the reel 20 is driven by the motor 201 to continuously move the substrate T in a predetermined direction at a predetermined speed so that the substrate T is taken up by the reel 20 from the reel 30.

Vacuum evaporation of the evaporation material is directed to an evaporation region on the surface of the continuously moving substrate T and radiation of ions is directed to a lower evaporation speed portion out of the center portion of the evaporation region, or a portion having a relatively lower rate of evaporation material atom arrival. In other words, the ions are directed to a portion of the evaporation region exhibiting a transport rate M/N in which a good adhesive mixed layer is formed, simultaneously with radiation of ions to the surface of the substrate in the more upstream pretreatment region S.

The pre-treatment step, such as for activating of the substrate surface and cleaning to remove water, is thus carried out by ion radiation of the surface of the continuously moving substrate. Then a mixed layer of constituent atoms of the substrate material and constituent atoms of the evaporation material is continuously formed on the pre-treated substrate surface. Then the mixed layer is made to pass through the center portion of the evaporation region, high in evaporation speed, and through a portion after the center portion, so that a vacuum evaporation film with a predetermined thickness is continuously formed on the mixed layer at a high film forming speed.

In the formation of the mixed layer, the radiation ion type and ion energy, the transport rate and the thickness of the mixed layer vary according to the kind of the material and the kind of the substrate, but it is preferable also in this case that the ion energy, the transport rate (M/N) and the thickness of the mixed layer are in ranges of from about 500 eV to about 20 KeV, from about 10 to about 1000 and from about 100 to 3000Å, respectively. The control portion 501 controls the ion source 40 and the evaporation source 50 to maintain these parameters respectively in the aforementioned ranges, The vacuum evaporation film with the predetermined thickness is continuously formed on the mixed layer preliminary formed, so that film forming is finished.

The film thus formed on the substrate T is totally adhered to the substrate T, because of the formation of the mixed layer on the surface of the substrate material after the pre-treatment step. Also, the film, is obtained easily and at low cost by successively carrying out the pre-treatment, the formation of the mixed layer and the formation of the vacuum evaporation film, using a single ion source and a single evaporation source as described above. Further, a good production efficiency is attained.

A specific example of film forming using the apparatus in FIG. 3 will now be described.

Substrate T: Polyimide film

Feeding speed: 6 m/min

Evaporation material from the evaporation source 50: aluminum

Film forming vacuum: 5×10$^{-5}$ Torr

Speed of film forming from the evaporation source 50: 2000 Å/sec

Ion source 40:

This is disposed so that a center axial line of an ion beam electrode intersects the surface of the substrate at a position B, as shown in FIG. 3, shifted by 300 mm to the upstream side in the direction of movement of the substrate from a point A of intersection between the center axial line of the evaporation source between the center axial line of the evaporation source 5 and the surface of the substrate and so that about one half of the surface ion beam is used for the pre-treatment.

Ion type: Argon ion

Energy: 2 KeV

Beam current density: 0.8 mA/cm$^2$.

Surface ion beam size at the substrate surface:

250 mm in the substrate feeding direction, 700 mm in a direction perpendicular thereto.

Transport rate M/N for forming the mixed layer: Al/Ar ion =80

A metallized film was thus obtained by forming an aluminum film of good adhesion on the polyimide film substrate T so that the thickness of the mixed layer and the thickness of the Al film were about 1000 Å and about 1 μm, respectively. The high adhesion of the film was kept stable by application of the pretreatment using ion radiation, so that the lowering of the adhesion of the aluminum film was not observed in the heat history (for example, from −30° C. to 130° C., in a film strength test and the like.

Figure 4:
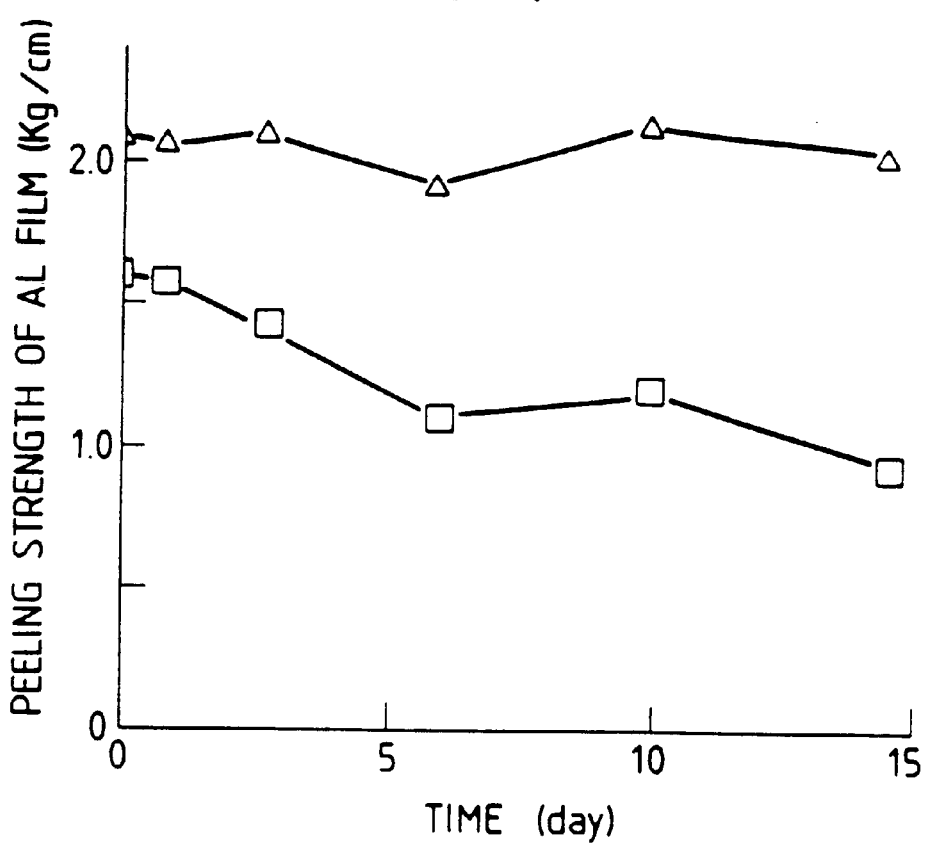
FIG. 4 is a graph showing the result of an aluminum film peeling strength test on a polyimide film.
Figure 5:
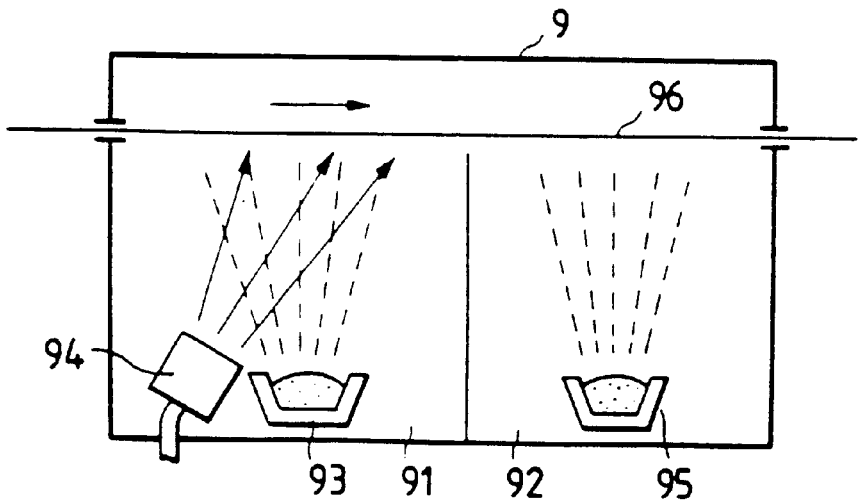
FIG. 5 an explanatory view showing a conventional apparatus.

To test the adhesion of the aluminum film, a comparative example was prepared with a polyimide film having an aluminum film formed in the same manner as in the aforementioned specific example except that a member (not shown) for preventing ion radiation to the pre-treatment region was used in the apparatus in to heat cycles (about one cycle per day) of −30° C. to 130° C. to be subjected to an aluminum film peeling strength test according to JISC-5016 after a predetermined time passed. The results of the test are shown in FIG. 4. In the graph FIG. 4, the line expressed by the symbol Δ shows the aluminum film in the specific example, and the line expressed by the symbol □ shows the aluminum film in the comparative example.

As is obvious from the results of the test, the adhesion of the aluminum film is reduced with the passage of time in the comparative example not using the ion radiation pre-treatment, whereas the adhesion of the aluminum film is higher and kept stable regardless of the passage of time in the specific example of the present invention using the ion radiation pretreatment.

it is to be understood that the present invention is not limited to the aforementioned embodiment and that it can be provided as various embodiments thereof. In the apparatus in FIG. 3 and the method of the invention using that apparatus, the reels 20 and 30 may be disposed outside the vacuum vessel 10 in the same manner as in the apparatus in FIG. 1B. In this case, if necessary, auxiliary vacuum chambers as in the apparatus in FIGS. 1A an 1B may be provided. Further, in the apparatus of FIG. 3, the deposition preventing plate 401 is not always necessary. Also in the apparatus of FIG. 1B, a part of the ion beam may be used for the pre-treatment and, further, a deposition preventing plates having the same function as the deposition preventing plate 401 having the same function as the deposition preventing plate 401 may be provided.

As described above, according to the present invention, a film forming method and a film forming apparatus can be provided in which a film can be continuously formed on a substrate easily, at low cost, and good adhesion compared to the conventional method and apparatus.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A film forming apparatus comprising:

means for continuously moving an objective substrate through a vacuum chamber;

an evaporation source disposed at a first location for vacuum evaporation of a material onto a substrate surface as the objective substrate is moved through the vacuum chamber in a first direction;

an ion source disposed at a second location for radiating ions having ion energy in a range of 500 eV to 8 KeV toward the substrate surface as the objective substrate is moved through the vacuum chamber in the first direction, said ion source being disposed so that the radiating ions form a mixed layer with the ration (M/N) of the number M of evaporation material atoms reaching the substrate surface per unit time and per unit area to the number N of ions reaching the substrate surface per unit time and per unit area being in a range from 10 to 1000;

the ion and evaporation sources operating to produce a mixed layer on the substrate surface as the substrate is moved through the vacuum chamber in the first direction; and the evaporation source operating to produce a film on the mixed layer on the substrate surface as the objective substrate is again moved through the vacuum chamber in the first direction or a second direction opposite to the first direction.

2. A film forming apparatus comprising:

means for continuously moving an objective substrate through a vacuum chamber in a first direction;

an evaporation source disposed at a first location for vacuum evaporation of a material onto a substrate surface as the objective substrate is moved through an evaporation region in the vacuum chamber where the vacuum evaporation onto the substrate surface is conducted;

an ion surface disposed at a second location for radiating ions having ion energy in a rang of 500 eV to 8 KeV toward the objective substrate as the substrate surface is moved through the vacuum chamber in the first direction, said ion source being disposed so that the radiating ions form a mixed layer with the ratio (M/N) of the number M of evaporation material atoms reaching the substrate surface per unit time per unit area to the number of ions reaching the substrate surface per unit time and per unit area is in a range of from 10 to 1000; and the ion and evaporation sources operating to apply the ions toward a portion of the vaporation region at an upstream position with respect to the first direction so that the mixed layer is first formed on the substrate surface and then an evaporation film is formed on the mixed layer.

3. A film forming apparatus according to claim 2, in which said ion source is disposed so that a part of said ion radiation is simultaneously applied to the substrate surface upstream from said surface region reached by the evaporation material from said evaporation source, whereby said surface of said substrate is pretreated before the formation of said mixture layer.

* * * * *